(12) United States Patent
Jang

(10) Patent No.: US 10,872,860 B2
(45) Date of Patent: Dec. 22, 2020

(54) SEMICONDUCTOR PACKAGE

(71) Applicant: SAMSUNG ELECTRONICS CO., LTD., Suwon-si (KR)

(72) Inventor: Min Sek Jang, Suwon-si (KR)

(73) Assignee: SAMSUNG ELECTRONICS CO.. LTD., Suwon-si (KR)

( * ) Notice: Subject to any disclaimer, the term of this patent is extended or adjusted under 35 U.S.C. 154(b) by 0 days.

(21) Appl. No.: 16/407,561

(22) Filed: May 9, 2019

(65) Prior Publication Data

US 2020/0144183 A1 May 7, 2020

(30) Foreign Application Priority Data

Nov. 6, 2018 (KR) .................. 10-2018-0135185

(51) Int. Cl.
*H01L 23/528* (2006.01)
*H01L 25/16* (2006.01)
*H01L 23/00* (2006.01)
*H01L 23/544* (2006.01)
*H01L 23/522* (2006.01)
*H01L 23/31* (2006.01)
*H01L 23/495* (2006.01)

(52) U.S. Cl.
CPC ...... *H01L 23/5283* (2013.01); *H01L 23/3128* (2013.01); *H01L 23/3135* (2013.01); *H01L 23/49575* (2013.01); *H01L 23/5226* (2013.01); *H01L 23/544* (2013.01); *H01L 24/09* (2013.01); *H01L 24/17* (2013.01); *H01L 25/16* (2013.01); *H01L 25/162* (2013.01); *H01L 2223/54433* (2013.01); *H01L 2224/02373* (2013.01); *H01L 2224/02377* (2013.01); *H01L 2224/02379* (2013.01); *H01L 2224/02381* (2013.01); *H01L 2924/15153* (2013.01)

(58) Field of Classification Search
CPC .............. H01L 25/162; H01L 23/3135; H01L 23/49575; H01L 2224/02379; H01L 2224/02377; H01L 2224/02373; H01L 23/544

See application file for complete search history.

(56) References Cited

U.S. PATENT DOCUMENTS 9,466,545 B1 * 10/2016 Scanlan ............... H05K 1/0216
2015/0271923 A1 * 9/2015 Shimabe .............. H05K 3/4602
174/251

(Continued)

*Primary Examiner* — Selim U Ahmed
*Assistant Examiner* — Evan G Clinton
(74) *Attorney, Agent, or Firm* — Sughrue Mion, PLLC

(57) ABSTRACT

A semiconductor package includes a connection structure including an insulating layer, a wiring layer disposed on the insulating layer, and a connection via penetrating through the insulating layer and connected to the wiring layer. A frame is disposed on the connection structure and has one or more through-holes. A semiconductor chip and passive components are disposed in the one or more through-holes of the frame on the connection structure. A first encapsulant covers at least portions of the passive components and the frame. A frame wiring layer is disposed on the frame, and a location identifying mark is disposed around the semiconductor chip on the frame and is spaced apart from the frame wiring layer. At least a portion of the location identifying mark is not covered by the first encapsulant.

19 Claims, 14 Drawing Sheets

(56) References Cited

U.S. PATENT DOCUMENTS

| | | |
|---|---|---|
| 2017/0062368 A1 | 3/2017 | Jung et al. |
| 2017/0271272 A1* | 9/2017 | Lee ...................... H01L 21/486 |
| 2018/0138396 A1* | 5/2018 | Nagel ..................... H01L 43/02 |
| 2020/0105679 A1* | 4/2020 | Bae ..................... H01L 23/4952 |
| 2020/0105680 A1* | 4/2020 | Lee ....................... H01L 23/552 |
| 2020/0118985 A1* | 4/2020 | Chae .................. H01L 23/3135 |

* cited by examiner

SEMICONDUCTOR PACKAGE

CROSS-REFERENCE TO RELATED APPLICATION(S)

This application claims benefit of priority to Korean Patent Application No. 10-2018-0135185 filed on Nov. 6, 2018 in the Korean Intellectual Property Office, the disclosure of which is incorporated herein by reference in its entirety.

BACKGROUND

1. Field

The present disclosure relates to a semiconductor package in which a semiconductor chip is mounted and modularized into a single package together with a plurality of passive components.

2. Description of Related Art

In accordance with an increase in a size of displays for mobile devices, a corresponding need has arisen for increasing the capacity of batteries. In accordance with the increase in the capacity of the batteries, an area occupied by the battery in the mobile device has increased, and it has been thus requested to reduce a size of a printed circuit board (PCB). Therefore, an area in which components are mounted has reduced, such that an interest in modularization has continuously increased.

Meanwhile, an example of the related art of mounting a plurality of components may include chip onboard (COB) technology. A COB mounting technique is a technique of mounting individual passive elements and a semiconductor package on a printed circuit board such as a main board using surface mounting technology (SMT). However, while such an approach has an advantage in terms of low cost, a wide mounting area is required to maintain a minimum interval between components, electromagnetic interference (EMI) between the components is large, and a distance between the semiconductor chip and the components is great, which results in increasing electrical noise.

SUMMARY

An aspect of the present disclosure may provide a semiconductor package capable of significantly reducing a mounting area of a semiconductor chip and passive components, significantly reducing electrical pathways between the semiconductor chip and the passive components, and improving the degree of precision of mounting of the semiconductor chip.

According to an aspect of the present disclosure, a semiconductor package may include a connection structure including an insulating layer, a wiring layer disposed on the insulating layer, and a connection via penetrating through the insulating layer and connected to the wiring layer. The semiconductor package further includes a frame disposed on the connection structure and having one or more through-holes, a semiconductor chip and passive components disposed in the one or more through-holes of the frame on the connection structure, a first encapsulant covering at least portions of the passive components and the frame, a frame wiring layer disposed on the frame, and a location identifying mark disposed around the semiconductor chip on the frame and spaced apart from the frame wiring layer. At least a portion of the marking region is not covered by the first encapsulant.

The semiconductor package may further include a second encapsulant covering at least a portion of the semiconductor chip.

The second encapsulant may cover side surfaces and an upper surface of the semiconductor chip, and the first encapsulant.

The first and second encapsulants may form a discontinuous interface.

The second encapsulant may cover an exposed portion of the location identifying mark which is not covered by the first encapsulant.

The semiconductor chip and the passive components may be disposed in a same through-hole of the one or more through-holes of the frame.

The first encapsulant may extend into the same through-hole of the frame, and the semiconductor chip may be disposed in a through-hole formed in the first encapsulant that extends into the same through-hole of the frame.

A metal layer may be disposed on an inner wall of the first encapsulant forming the through-hole formed in the first encapsulant.

The semiconductor chip and the passive components may be disposed in different through-holes of the one or more through-holes.

A metal layer may be disposed on inner walls of the frame forming the one or more through-holes.

The location identifying mark may take the form of metal patterns.

The location identifying mark and the frame wiring layer may be formed of the same material as each other.

The location identifying mark may be physically and electrically separated from the frame wiring layer.

The location identifying mark may have a symmetrical structure in relation to the through-hole of the frame in which the semiconductor chip is disposed when viewed from above.

The semiconductor chip may be disposed so that connection pads of the semiconductor chip face the connection structure.

In accordance with another aspect of the disclosure, a semiconductor package may include a frame having an upper surface, a lower surface opposing the upper surface, and a through-hole extending from the upper surface to the lower surface. A semiconductor chip is disposed in the through-hole, and a plurality of identifying marks are symmetrically disposed relative to the semiconductor chip on the upper surface of the frame.

The semiconductor package may further include a conductive frame wiring layer disposed on the upper surface of the frame, where the identifying marks are disposed around the semiconductor chip on the upper surface of the frame to be spaced apart from the frame wiring layer.

The identifying marks and the conductive frame wiring layer may be formed of a same material as each other.

The semiconductor package may further include an encapsulant covering a portion of the frame and extending into the through-hole between the frame and the semiconductor, where the identifying marks are free of the encapsulant.

The semiconductor package may further include one or more passive components disposed in the through-hole, electrically connected to the semiconductor chip, and embedded in the encapsulant.

The semiconductor package may further include a connection structure including a redistribution layer connected to connection pads of the semiconductor chip, where the lower surface of the frame is disposed on the connection structure.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
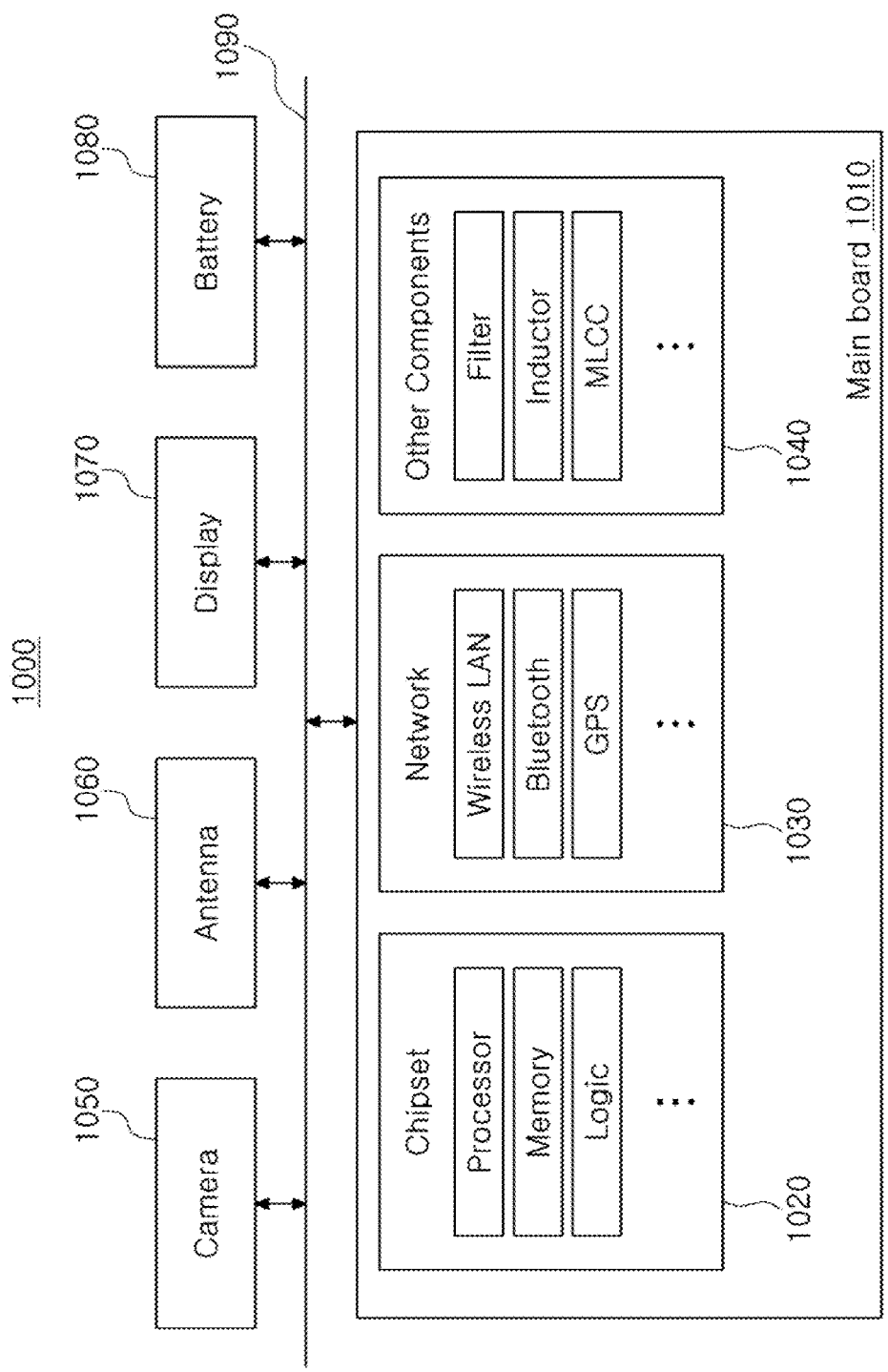
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically and/or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
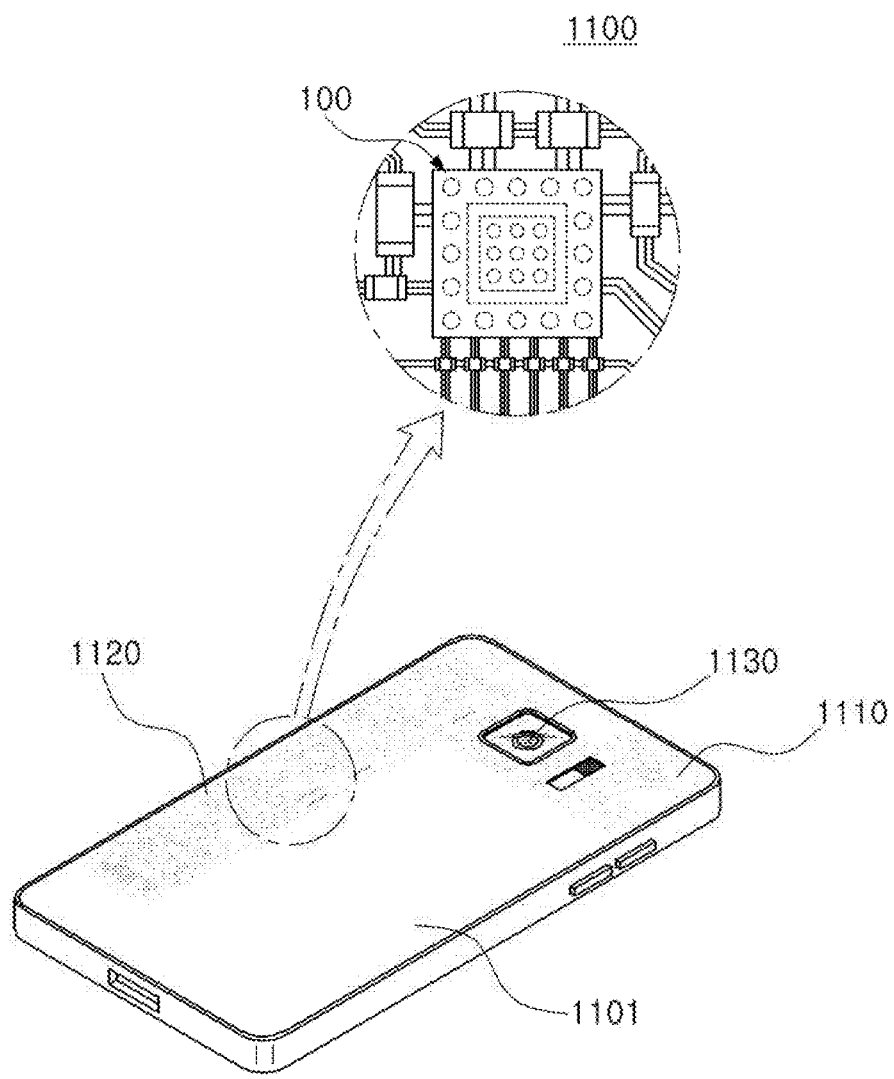
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a main board or the like may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is used due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is used.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
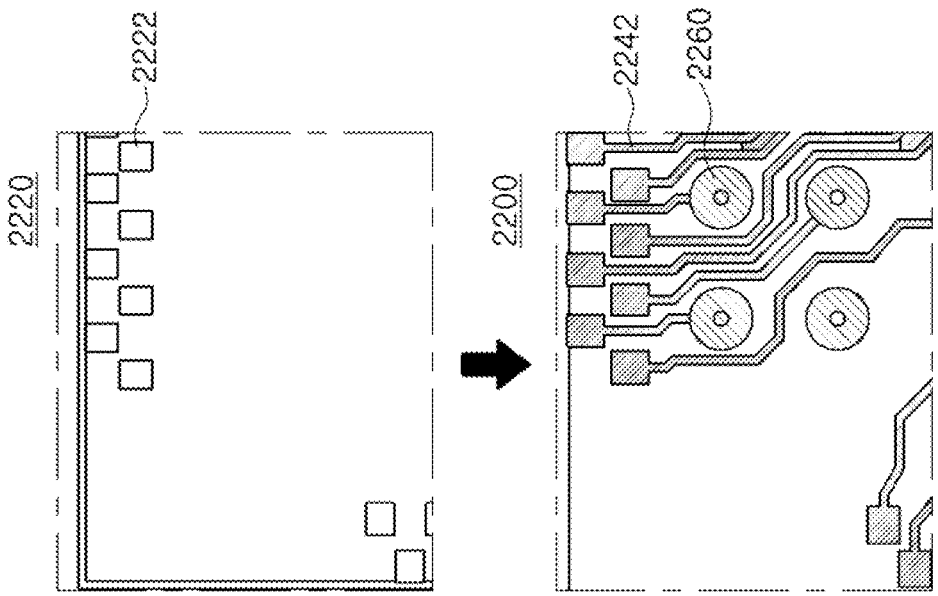
FIGS. 3A and 3B are schematic cross-sectional views illustrating a fan-in semiconductor package before and after being packaged.
Figure 3A:
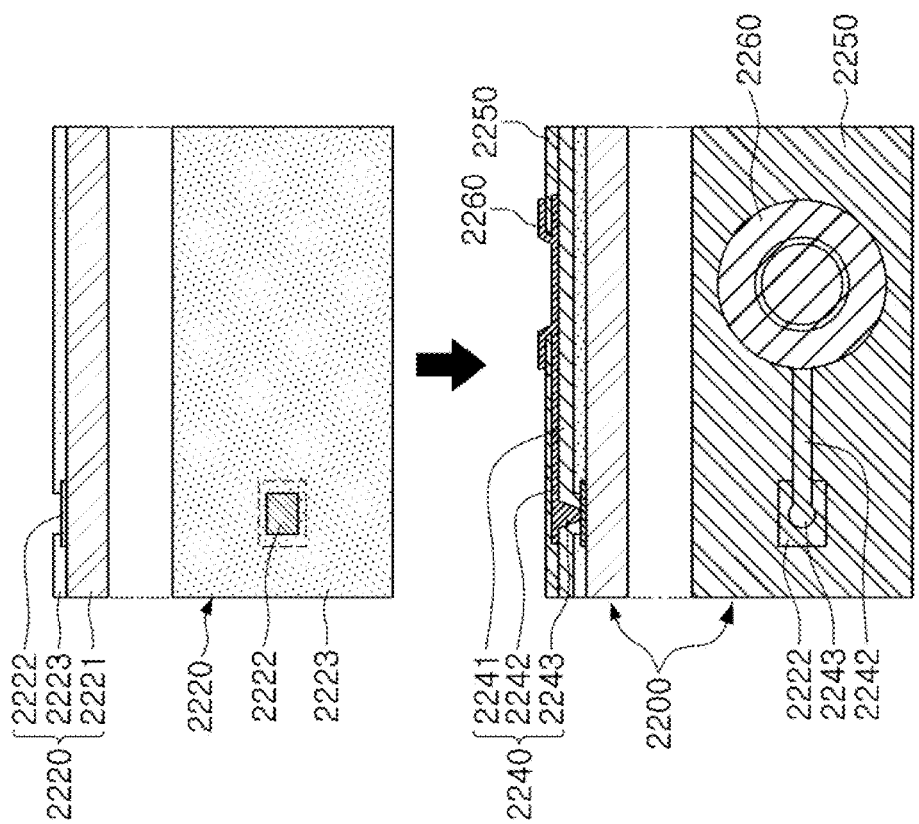

FIGS. 3A and 3B are schematic cross-sectional views illustrating states of a fan-in semiconductor package before and after being packaged.

Figure 4:
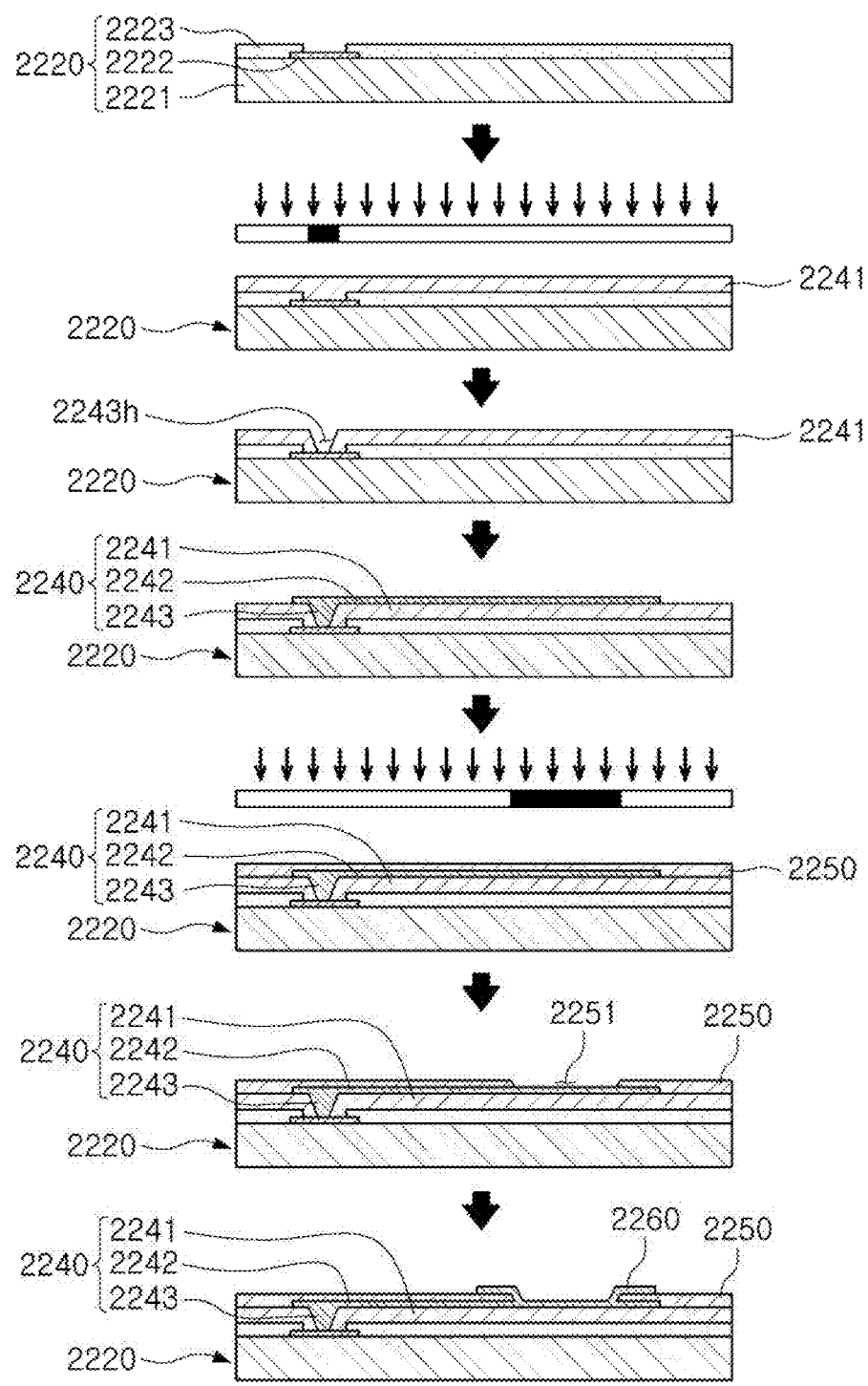
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as photo imageable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
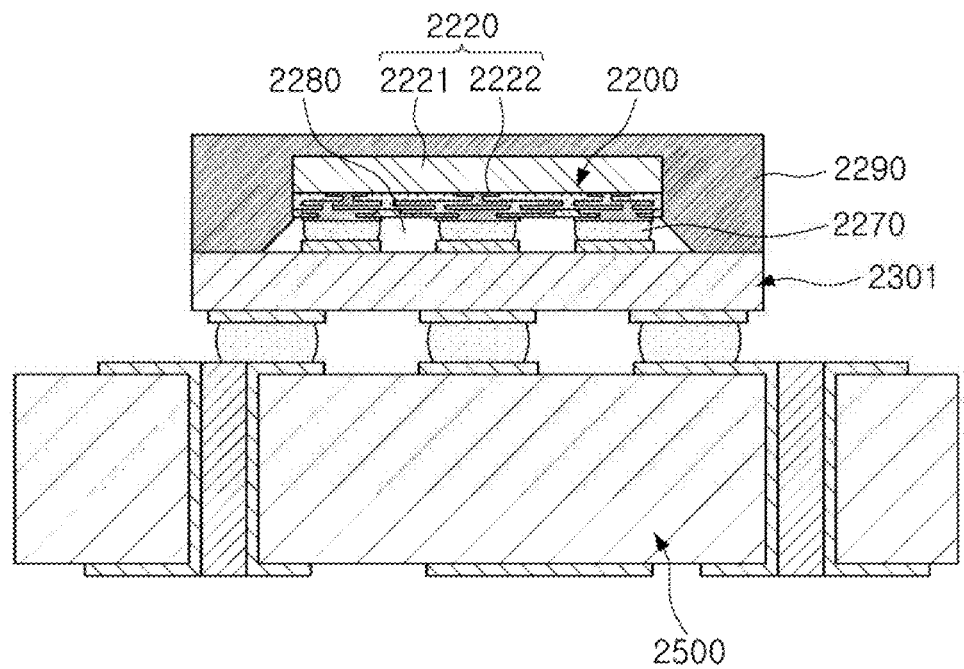
FIG. 5 is a schematic cross-sectional view illustrating a fan-in semiconductor package mounted on a printed circuit board and finally mounted on a main board of an electronic device.

FIG. 5 is a schematic cross-sectional view illustrating a case in which a fan-in semiconductor package is mounted on a printed circuit board and is finally mounted on a main board of an electronic device.

Figure 6:
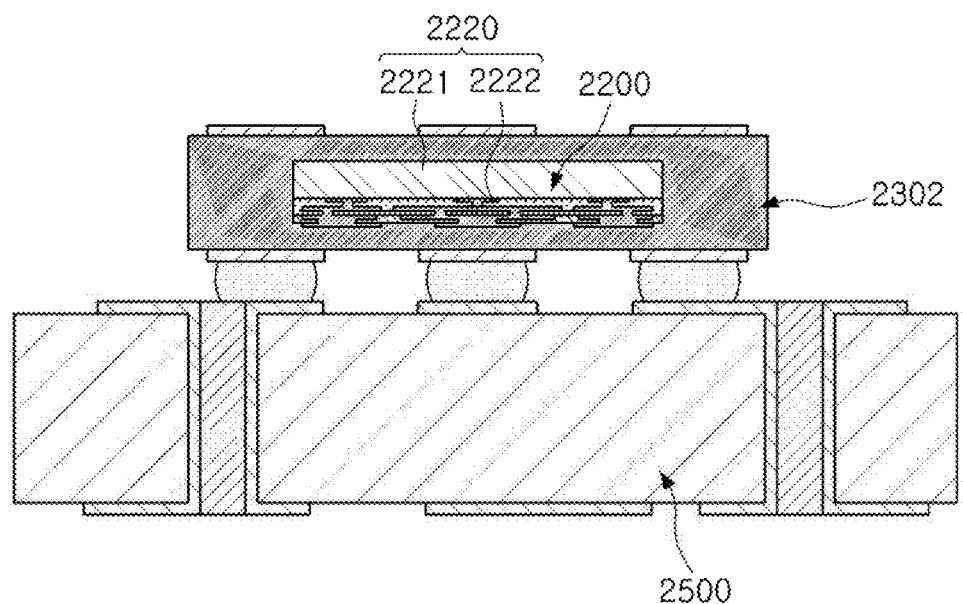
FIG. 6 is a schematic cross-sectional view illustrating a fan-in semiconductor package embedded in a printed circuit board and finally mounted on a main board of an electronic device.

FIG. 6 is a schematic cross-sectional view illustrating a case in which a fan-in semiconductor package is embedded in a printed circuit board and is finally mounted on a main board of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be finally mounted on a main board 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate printed circuit board and be then mounted on the main board of the electronic device through a packaging process or may be mounted and used on the main board of the electronic device in a state in which it is embedded in the printed circuit board.

Fan-Out Semiconductor Package

Figure 7:
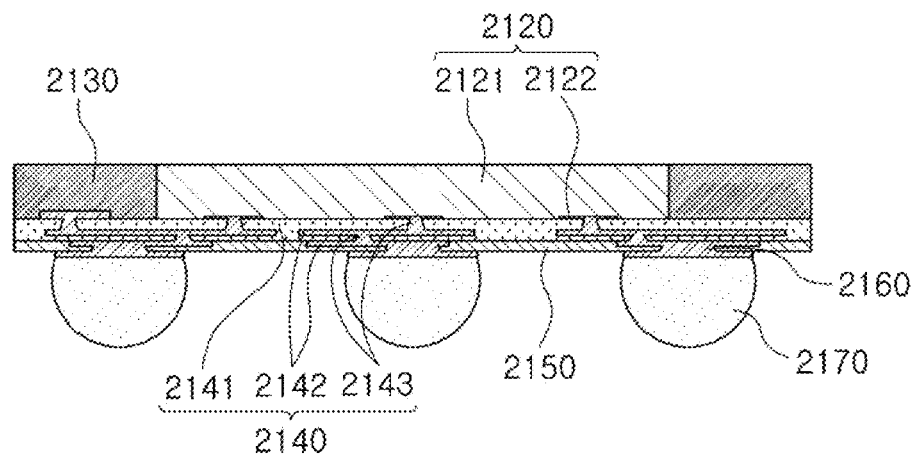
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. Here, a passivation layer 2150 may be further formed on the connection structure 2140, and underbump metal layers 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2241, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate printed circuit board, as described below.

Figure 8:
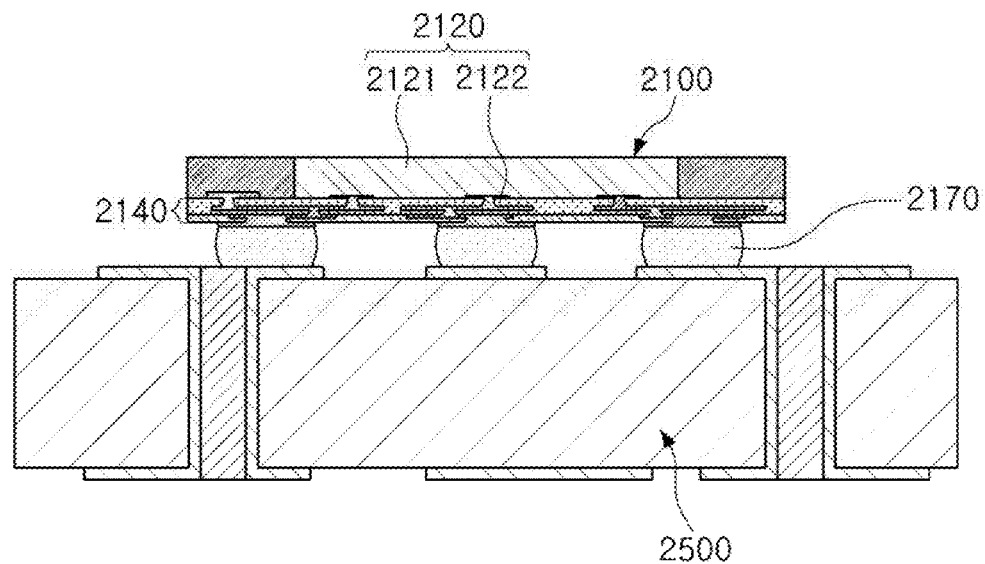
FIG. 8 is a schematic cross-sectional view illustrating a fan-out semiconductor package mounted on a main board of an electronic device.

FIG. 8 is a schematic cross-sectional view illustrating a case in which a fan-out semiconductor package is mounted on a main board of an electronic device;

Referring to FIG. 8, a fan-out semiconductor package 2100 may be mounted on a main board 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a printed circuit board, or the like.

As described above, since the fan-out semiconductor package may be mounted on the main board of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

Hereinafter, a semiconductor package having a novel structure capable of significantly reducing a mounting area of a semiconductor chip and a passive component, significantly reducing an electrical pathway between the semiconductor chip and the passive component, significantly reducing process defect such as undulation or crack, and easily connecting electrodes of the passive component with connection vias by a laser-via hole machining will be described with reference to the accompanying drawings.

Figure 9:
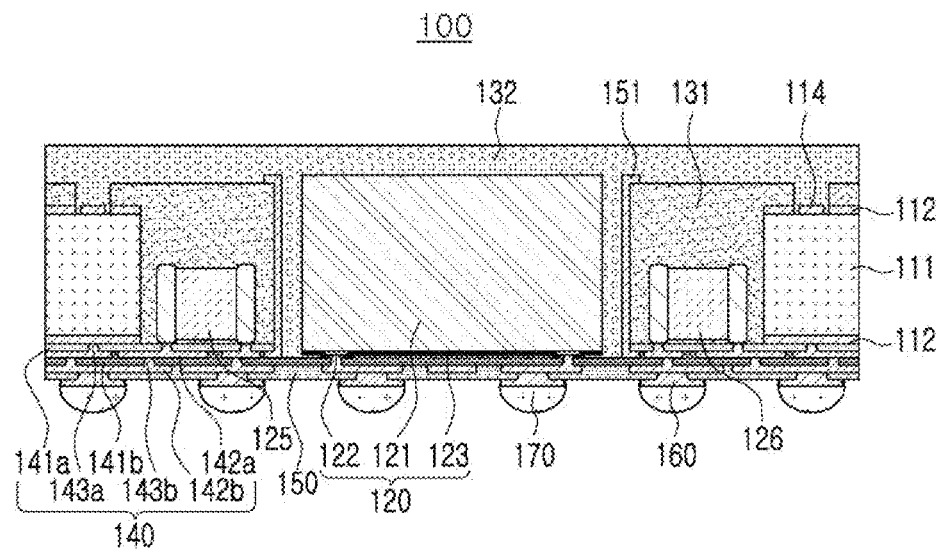
FIG. 9 is a schematic cross-sectional view illustrating an example of a semiconductor package having location identifying marks.
Figure 10:
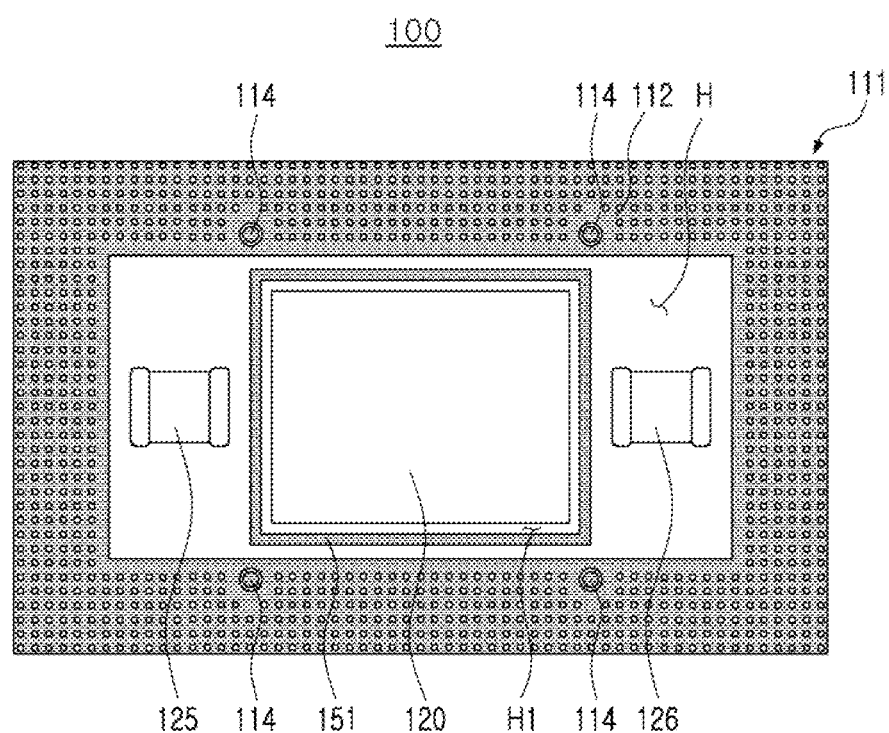
FIG. 10 is a plan view of the semiconductor package of FIG. 9 when viewed from above and illustrates a semiconductor chip, passive components, a marking region, and the like as main components.
Figure 11:
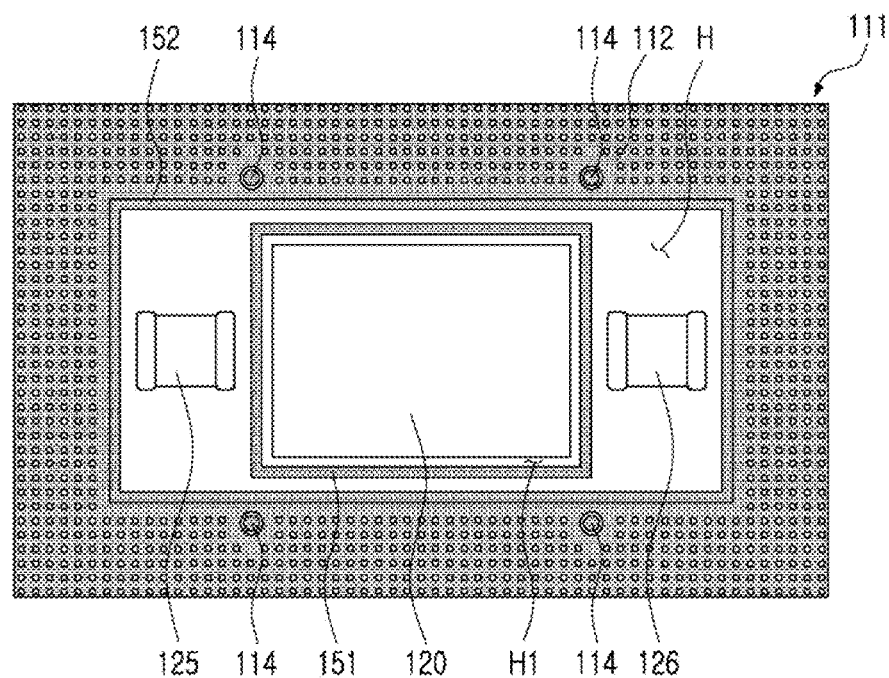
FIGS. 11 and 12 illustrate plan views of semiconductor packages according to modified examples.
Figure 12:
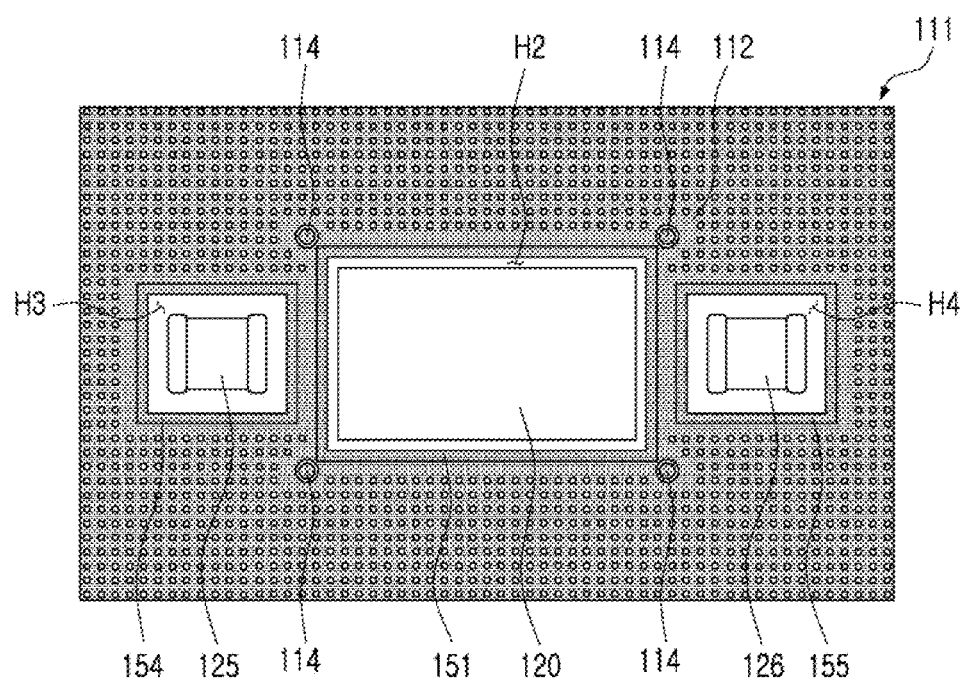

FIG. 9 is a schematic cross-sectional view illustrating an example of a semiconductor package. FIG. 10 is a plan view of the semiconductor package of FIG. 9 when viewed from above and illustrates a semiconductor chip, passive components, a marking region, and the like as main components. In addition, FIGS. 11 and 12 illustrate plan views of semiconductor packages according to modified examples, and correspond to the view shown in FIG. 10.

Referring to FIGS. 9 and 10, a semiconductor package 100 according to an example may include a connection structure 140, a frame 111, a semiconductor chip 120, passive components 125 and 126, and a first encapsulant 131 as main components, and a marking region 114 may be disposed around the semiconductor chip 120 on the frame 111. In addition, the semiconductor package 100 may further include a second encapsulant 132, a frame wiring layer 112, a passivation layer 150, underbump metal layers 160, electrical connection metals 170, and the like.

The connection structure 140 may include insulating layers 141a and 141b, wiring layers 142a and 142b disposed on the insulating layers 141a and 141b, and connection vias 143a and 143b penetrating through the insulating layers 141a and 141b and connected to the wiring layers 142a and 142b. The connection structure 140 having the form as described above may redistribute the connection pads 122 of the semiconductor chip 120. In addition, the connection structure 140 may electrically connect the connection pads 122 of the semiconductor chip 120 to the passive components 125 and 126, or the like. Several tens to several millions of connection pads 122 of the semiconductor chip 120 having various functions may be redistributed by the connection structure 140. The connection structure 140 may be designed with a smaller number of layers or a larger number of layers than those illustrated in the drawing.

In the present exemplary embodiment, the insulating layers 141a and 141b may include a first insulating layer 141a and a second insulating layer 141b. As shown, the first insulating layer 141a may be disposed below the frame 111 and the passive components 125 and 126, a first wiring layer 142a may be disposed on a lower surface of the first insulating layer 141a, and a first connection via 143a may penetrate through the first insulating layer 141a. In addition, the second insulating layer 141b may be disposed on a lower surface of the first insulating layer 141a and an active surface of the semiconductor chip 120 and may cover at least a portion of the first wiring layer 142a, and a second connection via 143b contacting the second wiring layer 142b and penetrating through the second insulating layer 141b and connected to the first and second wiring layers 142a and 142b and the connection pads 122 of the semiconductor chip 120. The second wiring layer 142b may be disposed on a lower surface of the second insulating layer 141b. As the connection structure 140 has the above-mentioned structure, levels of a region in which the semiconductor chip 120 is disposed and a region in which the passive components 125 and 126 are disposed may be different from each other. Specifically, as shown, in the connection structure 140 of FIG. 9, the level of the region in which the semiconductor chip 120 is disposed may be lower than the level of the region in which the passive components 125 and 126 are disposed (e.g., the connection structure 140 may have a lower thickness in the region in which the semiconductor chip 120 than in the region in which the passive components 125 and 126 are disposed). However, the connection structure 140 does not necessarily include the first and second insulating layers 141a and 141b but only one kind of insulating layer may be used depending on the exemplary embodiment.

A material of the first insulating layer 141a may be an insulating material. In this case, the insulating material may be a non-photo imageable dielectric material including an inorganic filler such as silica or alumina, for example, ABF. In this case, an undulation problem and a problem of defect due to a crack occurrence may be more effectively solved. In addition, a problem of electrode open defect of the passive components 125 and 126 due to bleeding of a material forming the first encapsulant 131 may be effectively solved. That is, when the non-photo imageable dielectric material including the inorganic filler is used as the material of the first insulating layer 141a, the problem of the case in which the photo imageable dielectric (PID) material is simply used may be more effectively solved.

A photo imageable dielectric (PID) material may be used as a material of the second insulating layer 141b. In this case, a fine pitch may also be introduced through a photo via, and several tens to several millions of connection pads 122 of the semiconductor chip 120 may be thus very effectively redistributed similarly to a normal case. The photo imageable dielectric (PID) material may or may not include a small amount of inorganic filler. That is, by selectively controlling the materials of the first insulating layer 141a on which the first wiring layer 142a and the first connection via 143a are formed for redistributing the passive components 125 and 126, and the second insulating layer 141b on which the second wiring layer 142b and the second connection via 143b are formed for redistributing the connection pads 122 of the semiconductor chip 120, a better synergy effect may be created.

Meanwhile, the first insulating layer 141a formed of the non-photo imageable dielectric (PID) material including the inorganic filler may be a plurality of layers, and the second insulating layer 141b formed of the photo imageable dielectric (PID) material may be a plurality of layers, all of which may be a plurality of layers. In this case, a through-hole H1 formed in the first encapsulant 131 may penetrate through the first insulating layer 141a, and may penetrate through a plurality of layers when the first insulating layer 141a is the plurality of layers.

The first insulating layer 141a may have a coefficient of thermal expansion (CTE) smaller than that of the second insulating layer 141b. The reason is because the first insulating layer 141a includes the inorganic filler. The second insulating layer 141b may include a small amount of inorganic filler, but in this case, a weight percentage of the inorganic filler included in the first insulating layer 141a may be greater than the weight percentage of the inorganic filler of the second insulating layer 141b. Therefore, the coefficient of thermal expansion (CTE) of the first insulating layer 141a may be smaller than the coefficient of thermal expansion (CTE) of the second insulating layer 141b. The first insulating layer 141a having a relatively larger amount of inorganic filler has a relatively small coefficient of thermal expansion (CTE), and thus has a small thermosetting shrinkage and is advantageous for preventing warpage. As a result, as described above, the problem of undulation or crack occurrence may be more effectively solved, and the problem of the electrode open defect of the passive components 125 and 126 may also be more effectively solved.

The first wiring layer 142a may redistribute electrodes of the passive components 125 and 126 and electrically connect the electrodes to the connection pads 122 of the semiconductor chip 120. That is, the first wiring layer 142a may serve as a redistribution layer (RDL). A material of the first wiring layer 142a may be a conductive material such as copper (Cu), aluminum (Al), silver (Ag), tin (Sn), gold (Au), nickel (Ni), lead (Pb), titanium (Ti), or alloys thereof. The first wiring layer 142a may perform various functions depending on a design thereof. For example, the first wiring layer 142a may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first wiring layer 142a may include via pads, and the like. Since the through-hole H1 in which the semiconductor chip 120 is disposed also penetrates through the first insulating layer 141a, a lower surface of the first wiring layer 142a may be positioned at the substantially same level as that of the active surface of the semiconductor chip 120. That is, the first wiring layer 142a may be co-planar with the active surface of the semiconductor chip 120.

The second wiring layer 142b may redistribute the connection pads 122 of the semiconductor chip 120 and electrically connect the connection pads 122 to the electrical connection structure 170. That is, the second wiring layer 142b may serve as a redistribution layer (RDL). A material of the second wiring layer 142b may also be a conductive material such as copper (Cu), aluminum (Al), silver (Ag), tin (Sn), gold (Au), nickel (Ni), lead (Pb), titanium (Ti), or alloys thereof described above. The second wiring layer 142*b* may also perform various functions depending on a design thereof. For example, the second wiring layer 142*b* may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second wiring layer 142*b* may include via pads, electrical connection structure pads, and the like.

The first connection via 143*a* may electrically connect the passive components 125 and 126 and the first wiring layer 142*a* to each other. At least some of the first connection via(s) 143*a* may be in physical contact with each of the electrodes of the passive components 125 and 126. That is, the passive components 125 and 126 may be in direct contact with first connection via(s) 143*a* in an embedded type, not the surface mounting form using a solder bump, or the like. A material of the first connection via 143*a* may be a conductive material such as copper (Cu), aluminum (Al), silver (Ag), tin (Sn), gold (Au), nickel (Ni), lead (Pb), titanium (Ti), or alloys thereof. The first connection via 143*a* may be completely filled with the conductive material, or the conductive material may also be formed along a wall of the via. In addition, the first connection via 143*a* may have a tapered shape.

The second connection via 143*b* may electrically connect the first and second wiring layers 142*a* and 142*b* formed on different layers to each other, and may also electrically connect the connection pads 122 of the semiconductor chip 120 to the second wiring layer 142*b*. The second connection via 143*b* may be in physical contact with the connection pads 122 of the semiconductor chip 120. That is, the semiconductor chip 120 may be directly connected to the second connection via(s) 143*b* of the connection structure 140 without a separate bump or the like in the form of a bare die. A material of the second connection via 143*b* may also be a conductive material such as copper (Cu), aluminum (Al), silver (Ag), tin (Sn), gold (Au), nickel (Ni), lead (Pb), titanium (Ti), or alloys thereof. The second connection via 143*b* may also be completely filled with the conductive material, or the conductive material may be formed along a wall of the via. In addition, as a shape of the second connection via 143*b*, a tapered shape may also be applied.

In the semiconductor package 100 according to the present exemplary embodiment, the passive components 125 and 126 may be disposed and modularized in a single package together with the semiconductor chip 120. Therefore, an interval between the components may be significantly reduced, and a mounting area of the components on a printed circuit board such as a main board may be significantly reduced. In addition, electrical pathways between the semiconductor chip 120 and the passive components 125 and 126 may be significantly reduced to solve a noise problem. In addition, sealing processes using the encapsulants 131 and 132 of two steps or more may be performed rather than a single sealing, and therefore, a yield problem of the semiconductor chip 120 according to mounting defect of the passive components 125 and 126, or an influence of foreign substances generated when the passive components 125 and 126 are mounted may be significantly reduced.

Meanwhile, since the connection pads of the semiconductor chip are typically formed of aluminum (Al), the connection pads may be easily damaged due to damage during laser-via machining. Therefore, it is common to open the connection pads by photo-via machining, rather than a laser via. To this end, as the insulating layer provided to form the redistribution layer (RDL), the photo imageable dielectric (PID) material may be used. However, when the photo imageable dielectric (PID) material is stacked on the lower surfaces of the passive components to form the redistribution layer (RDL), the undulation may occur due to protrusion of the electrodes of the passive components, and as a result, flatness of the photo imageable dielectric (PID) material may be decreased. Therefore, there is an inconvenience of using a photo imageable dielectric (PID) material having a thick thickness in order to increase the flatness, and in this case, there is a problem that a large number of cracks may occur easily due to the thickness of the photo imageable dielectric (PID).

In addition, when the passive components are sealed by using the encapsulant, a problem that a material of the encapsulant bleeds into the electrodes of the passive components may occur. In this case, when the photo imageable dielectric (PID) material is used to form the redistribution layer (RDL), the photo-via machining may be used as described above. In this case, it is difficult to open the material of the bled material of the encapsulant by the photo-via machining. Therefore, a defect of an electrode open may occur by the bled material of the encapsulant, and as a result, a decrease in electrical characteristics may be caused.

On the other hand, in the semiconductor package 100 according to an example, after through-holes H in which the passive components 125 and 126 are disposed are formed, the passive components 125 and 126 may be disposed, and the first insulating layer 141*a* and the first wiring layer 142*a* may be then primarily formed to redistribute the passive components 125 and 126. Thereafter, a through-hole H1 penetrating through the first insulating layer 141*a* may be formed in the first encapsulant 131 and the semiconductor chip 120 may be disposed in the through-hole H1, and the second insulating layer 141*b* and the second wiring layer 142*b* may be secondarily formed to redistribute the semiconductor chip 120. That is, the through-hole H1 in the first encapsulant 131 in which the semiconductor chip 120 is disposed may penetrate through the first insulting layer 141*a* of the connection structure 140 as well as the frame 111, and accordingly, the active surface of the semiconductor chip 120 may be positioned below the lower surface of each of the passive components 125 and 126.

In this case, the material of the first insulating layer 141*a* may be selected independently of the semiconductor chip 120 and of the material of the second insulating layer 141*b*, and for example, a non-photo imageable dielectric material including inorganic filler, for example, an Ajinomoto Build-up Film (ABF), or the like, may be used instead of any photo imageable dielectric (PID) material. Since a film type of non-photo imageable dielectric material has excellent flatness, it may more effectively solve the undulation problem and the problem of the crack occurrence described above.

In addition, since such a non-photo imageable dielectric material forms openings by a laser via, the electrodes of the passive components 125 and 126 may be effectively opened through the laser via even though the material of the first encapsulant 131 is bled into the electrodes of the passive components 125 and 126. Therefore, a problem caused by the electrode open defect may also be solved.

Further, in the semiconductor package 100 according to an example, the photo imageable dielectric (PID) material may be used as a material of the second insulating layer 141*b* as in a normal case. In this case, a fine pitch may also be introduced through a photo via, and several hundreds to several millions of connection pads 122 of the semiconductor chip 120 may be thus very effectively redistributed similarly to a normal case. That is, a structure of the semiconductor package 100 according to an example may selectively control the materials of the first insulating layer 141a on which the first wiring layer 142a and the first connection via 143a for redistributing the passive components 125 and 126 are formed, and the second insulating layer 141b on which the second wiring layer 142b and the second connection via 143b for redistributing the connection pads 122 of the semiconductor chip 120 are formed, and may thus have a better synergy effect. In particular, different materials can be used for forming the first and second insulating layers 141a and 141b.

The frame 111 may form a core region of the semiconductor package 100 to perform a supporting function, or the like. An insulating material for the frame 111 may be a thermosetting resin such as an epoxy resin, a thermoplastic resin such as polyimide, a resin in which the thermosetting resin and the thermoplastic resin are impregnated together with an inorganic filler such as silica in a core material such as a glass fiber (or a glass cloth or a glass fabric), for example, prepreg, Ajinomoto Build up Film (ABF), or the like.

As shown, the frame 111 may include at least one through-hole H, and in the present exemplary embodiment, the frame 111 may correspond to a structure having one through-hole H. In this case, as in a modified example of FIG. 11, a metal layer 152 may be disposed on an inner wall of the frame 111 in which the through-hole H is formed. The metal layer 152 may include copper (Cu), aluminum (Al), silver (Ag), tin (Sn), gold (Au), nickel (Ni), lead (Pb), titanium (Ti), or alloys thereof, but is not limited thereto. In addition, an electromagnetic wave shielding and heat dissipation of the semiconductor chip 120 and the passive components 125 and 126 may be achieved through the metal layer 152. The metal layer 152 may be connected to the frame wiring layer 112 on the upper surface of the frame 111 and may also be used as a ground. In this case, the metal layer 152 may be electrically connected to the grounds of the wiring layers 142a and 142b of the connection structure 140.

The passive components 125 and 126 may be capacitors such as multilayer ceramic capacitors (MLCCs) or low inductance chip capacitors (LICCs), inductors such as power inductors, and beads. The passive components 125 and 126 may have different thicknesses from each other. In addition, each of the passive components 125 and 126 may have a thickness different from that of the semiconductor chip 120. Since the semiconductor package 100 according to an example encapsulates the passive components 125 and 126 with two or more steps, a defect problem caused by such thickness deviation may be significantly reduced. The number of passive components 125 and 126 is not particularly limited, but may be more than that illustrated in the drawing or may be less than that illustrated in the drawing.

The first encapsulant 131 may encapsulate each of the passive components 125 and 126. In addition, the first encapsulant 131 may fill the through-hole H of the frame 111 and may cover at least a portion of an upper portion of the frame 111. The first encapsulant 131 may include an insulating material, and the insulating material may be a material including an inorganic filler and an insulating resin, for example, a thermosetting resin such as an epoxy resin, a thermoplastic resin such as polyimide, a resin having a reinforcing material such as an inorganic filler impregnated in the thermosetting resin and the thermoplastic resin, such as Ajinomoto Build up Film (ABF), FR-4, Bismaleimide Triazine (BT), or the like. In addition, a molding material such as an epoxy molding compound (EMC) may be used, and a photo imageable dielectric material, that is, a photo imageable encapsulant (PIE) may also be used. A material in which an insulating resin such as a thermosetting resin or a thermoplastic resin is impregnated in inorganic filler and/or a core material such as a glass fiber (or a glass cloth or a glass fabric) may also be used as the insulating material.

The semiconductor chip 120 may be disposed in the through-hole H1 of the first encapsulant 131, and may be disposed on the connection structure 140 so that the connection pads 122 face (and contact) the connection structure 140. The semiconductor chip 120 may be spaced apart from a wall surface of the through-hole H1 by a predetermined distance and may be surrounded by the wall surface of the through-hole H1, but may be modified. As shown, the metal layer 151 may be disposed on side walls of the through-hole H1 of the first encapsulant 131. The metal layer 151 may include copper (Cu), aluminum (Al), silver (Ag), tin (Sn), gold (Au), nickel (Ni), lead (Pb), titanium (Ti), or alloys thereof, but is not limited thereto. In addition, an electromagnetic wave shielding and heat dissipation of the semiconductor chip 120 and of the passive components 125 and 126 may be achieved through the metal layer 151.

The semiconductor chip 120 may be an integrated circuit (IC) providing in an amount of several hundreds to several millions or more elements integrated in a single chip. In this case, the IC may be, for example, a power management IC (PMIC), but is not limited thereto, the IC may be a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an analog-to-digital converter, an application-specific IC (ASIC), or the like.

The semiconductor chip 120 may be an integrated circuit in a bare state in which a separate bump or wiring layer is not formed. The integrated circuit may be formed on the basis of an active wafer. In this case, a base material of the body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like without being particularly limited. A passivation layer 123 exposing the connection pads 122 may be formed on the body 121, and may be an oxide film, a nitride film, or the like, or a double layer of the oxide film and the nitride film. An insulating layer (not shown), and the like, may be further disposed in other appropriate positions. Meanwhile, a surface of the semiconductor chip 120 on which the connection pads 122 are disposed may be an active surface, and a surface of the semiconductor chip 120 opposing the active surface may be an inactive surface. In this case, when the passivation layer 123 is formed on the active surface of the semiconductor chip 120, the active surface of the semiconductor chip 120 may determine a positional relationship based on the lowest surface of the passivation layer 123.

In the present exemplary embodiment, a marking region 114 may be disposed to be spaced apart from the frame wiring layer 112 around the semiconductor chip 120 on the frame 111, and a region in which the semiconductor chip 120 is disposed may thus be precisely controlled. As shown, the marking region 114 includes a location identifying mark, and the marking region 114 and location identifying mark may not be covered by the first encapsulant 131 and may be exposed. Although FIG. 9 illustrates that an overall region of the marking region 114 is exposed, only at least a portion of the marking region 114 and location identifying mark may also be exposed.

As in the present exemplary embodiment, when the passive components 125 and 126 and the frame 111 are encapsulated by the first encapsulant 131, the marking region 114 may also be covered. In this case, when the semiconductor chip 120 is mounted, it may be difficult to identify the marking region 114, and as a result, a position deviation of the semiconductor chip 120 may be increased and amounting defect may occur. In the present exemplary embodiment, the degree of precision of placement of the semiconductor chip 120 at the time of mounting the semiconductor chip 120 may be improved by allowing at least a portion of the marking region 114 and location identifying mark not to be covered by the first encapsulant 131 and to be exposed. The marking region 114 and location identifying mark may be exposed by a method of removing a portion of the first encapsulant 131, or the like.

Meanwhile, the marking region 114 and location identifying mark may be in the form of metal patterns, and may be formed of the same material as that of the frame wiring layer 112 formed on the upper surface of the frame 111. In this case, the marking region 114 and location identifying mark may be physically and electrically separated from the frame wiring layer 112. For example, the frame wiring layer 112 and the marking region 114 and location identifying mark may be obtained by removing a portion of the conductive pattern, and may be separated from each other by removing a region of the conductive pattern therebetween.

In addition, in order for the marking region 114 and location identifying mark(s) to serve as alignment marks, the marking region 114 and location identifying mark(s) may have a symmetrical structure or disposition in relation to the through-hole H of the frame 111 in which the semiconductor chip 120 is disposed when viewed from above. For example, the marking region 114 and location identifying mark(s) may be disposed at regions corresponding to four corners of the semiconductor chip 120 when viewed from above, so as to be symmetrically disposed around the semiconductor chip 120. However, while the marking region 114 is represented in FIG. 10 by a circular shape when viewed from above, a shape thereof may be changed. For example, the marking region 114 may also be formed in a cross shape, a square shape, a ring shape, or the like when viewed from above.

In one example, the semiconductor chip 120 may have a symmetrical aspect when viewed from above, such as a symmetry about an axis of symmetry bisecting the semiconductor chip 120. In such an example, one or more marking regions 114 and location identifying mark(s) may be disposed around the semiconductor chip 120 (e.g., on portions of the frame 111) so as to be symmetrical with each other around the axis of symmetry of the semiconductor chip 120. For instance, in each of FIGS. 10-12, the semiconductor chip 120 has a horizontal axis of symmetry (e.g., horizontal with respect to the depiction in the figure) and marking regions 114 and location identifying marks are disposed to be symmetrical with respect to each other about the horizontal axis of symmetry. Similarly in the figures, the semiconductor chip 120 has a vertical axis of symmetry (e.g., vertical with respect to the depiction in the figure) and marking regions 114 and location identifying marks are disposed to be symmetrical with respect to each other about the vertical axis of symmetry.

The second encapsulant 132 may encapsulate the semiconductor chip 120. In addition, the second encapsulant 132 may fill the through-hole H1 of the first encapsulant 131 and may also encapsulate the first encapsulant 131. For example, as shown in FIG. 9, the second encapsulant 132 may cover side surfaces and an upper surface of the semiconductor chip 120, and the first encapsulant 131. The second encapsulant 132 may include an insulating material, and for example, the insulating material may be a material including an inorganic filler and an insulating resin, for example, a thermosetting resin such as an epoxy resin, a thermoplastic resin such as polyimide, a resin having a reinforcing material such as inorganic filler included in the thermosetting resin and the thermoplastic resin, such as ABF, FR-4, BT, a PID resin, or the like. In addition, a molding material such as an epoxy molding compound (EMC), or the like, may also be used. A material in which an insulating resin such as a thermosetting resin or a thermoplastic resin is impregnated in inorganic filler and/or a core material such as a glass fiber (or a glass cloth or a glass fabric) may also be used. In this case, as shown, the second encapsulant 132 may cover exposed region(s) of the marking region 114 which are not covered by the first encapsulant 131.

The first encapsulant 131 and the second encapsulant 132 may include the same material, or may include different materials. Even in the case in which the first encapsulant 131 and the second encapsulant 132 include the same material, a boundary therebetween may form a discontinuous interface and may be confirmed. The first encapsulant 131 and the second encapsulant 132 may include similar materials and colors of the materials may be different from each other. For example, the first encapsulant 131 may be more transparent than the second encapsulant 132. That is, the boundary between the first and second encapsulants 131 and 132 may be apparent. In certain embodiments, the first encapsulant 131 may be formed of an insulating material and the second encapsulant 132 may be formed of a magnetic material. In this case, the second encapsulant 132 may have an EMI absorption effect.

The passivation layer 150 may protect the connection structure 140 from external physical or chemical damage. The passivation layer 150 may have openings exposing at least portions of the wiring layers 142a and/or 142b of the connection structure 140. The number of openings formed in the passivation layer 150 may be several tens to several thousands. The passivation layer 150 may include an insulating resin and inorganic filler, but may not include a glass fiber. For example, the passivation layer 150 may be formed of ABF, but is not limited thereto.

The underbump metal layers 160 may improve connection reliability of the electrical connection metals 170, and thus improve board level reliability of the semiconductor package 100. The underbump metal layers 160 may be connected to the second wiring layer 142b of the connection structure 140 exposed through the openings of the passivation layer 150. The underbump metal layers 160 may be formed in the openings of the passivation layer 150 by a metallization method using a conductive material such as a metal, but is not limited thereto.

The electrical connection metals 170 may be configured to physically and/or electrically externally connect the semiconductor package 100. For example, the semiconductor package 100 may be mounted on the main board of the electronic device through the electrical connection metals 170. The electrical connection metals 170 may be formed of a low-melting point metal, for example, tin (Sn) or an alloy containing tin (Sn). More specifically, the electrical connection metals 170 may be formed of a solder, or the like. However, this is only an example, and a material of each of the electrical connection metals 170 is not particularly limited thereto. Each of the electrical connection metals 170 may be a land, a ball, a pin, or the like. The electrical connection metals 170 may be formed as a multilayer or single layer structure. When the electrical connection metals 170 are formed as a multilayer structure, the electrical connection metals 170 may include a copper (Cu) pillar and a solder. When the electrical connection metals 170 are formed as a single layer structure, the electrical connection metals 170 may include a tin-silver solder or copper (Cu). However, this is only an example, and the electrical connection metals 170 are not limited thereto. The number, an interval, a disposition form, and the like, of electrical connection metals 170 are not particularly limited, but may be sufficiently modified depending on design particulars. For example, the electrical connection metals 170 may be provided in an amount of several tens to several thousands according to the number of connection pads 122, or may also be provided in an amount of several tens to several thousands or more or several tens to several thousands or less.

At least one of the electrical connection metals 170 may be disposed in a fan-out region. The fan-out region is a region except for (or outside of) a region in which the semiconductor chip 120 is disposed (e.g., a region outside of a region of overlap with the semiconductor chip 120 in a stacking direction of the semiconductor chip 120 on the connection structure 140). The fan-out package may have reliability greater than that of a fan-in package, may implement a plurality of I/O terminals, and may easily perform 3D interconnection. In addition, as compared to a ball grid array (BGA) package, a land grid array (LGA) package, or the like, the package may be manufactured to have a small thickness, and may have price competitiveness.

Meanwhile, the exemplary embodiments of FIGS. 9-11 illustrate forms in which the semiconductor chip 120 and the passive components 125 and 126 are disposed in the same through-hole H in the frame 111, but may be modified as shown in FIG. 12. In a modified example of FIG. 12, the semiconductor chip 120 and the passive components 125 and 126 may be disposed in different through-holes H2, H3, and H4 in the frame 111, and metal layers 151, 154, and 155 may be each disposed on an inner wall of each of the through-holes H2, H3, and H4.

Figure 13:
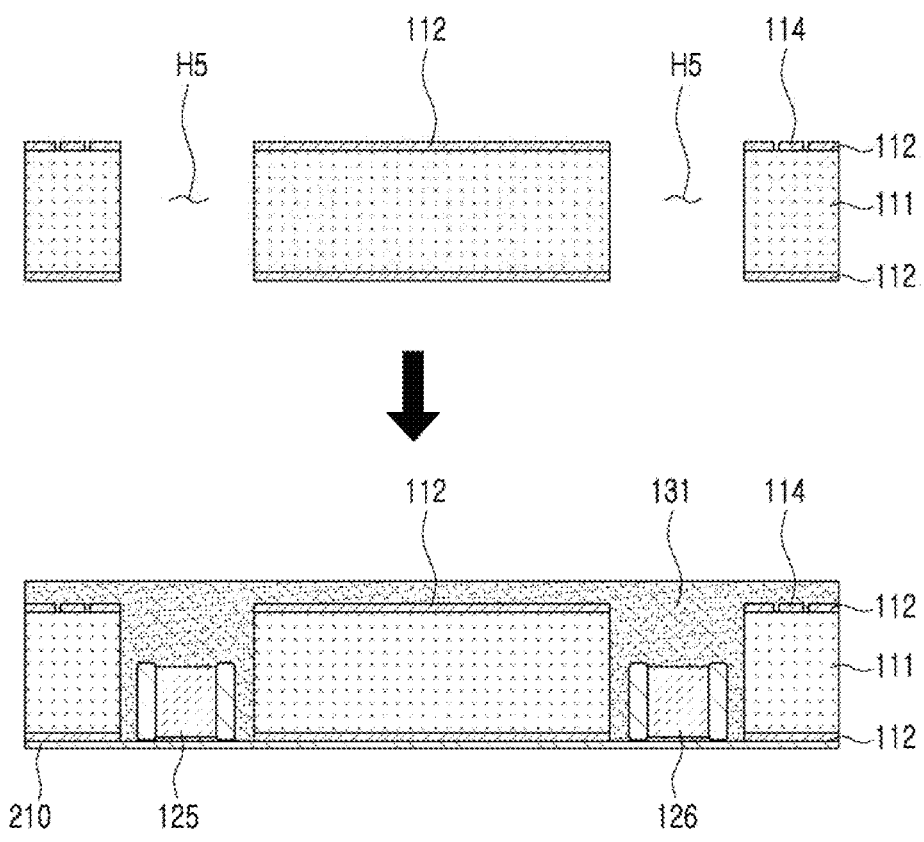
FIGS. 13 through 15 are schematic views illustrating examples of processes for manufacturing the semiconductor package of FIG. 9.
Figure 14:
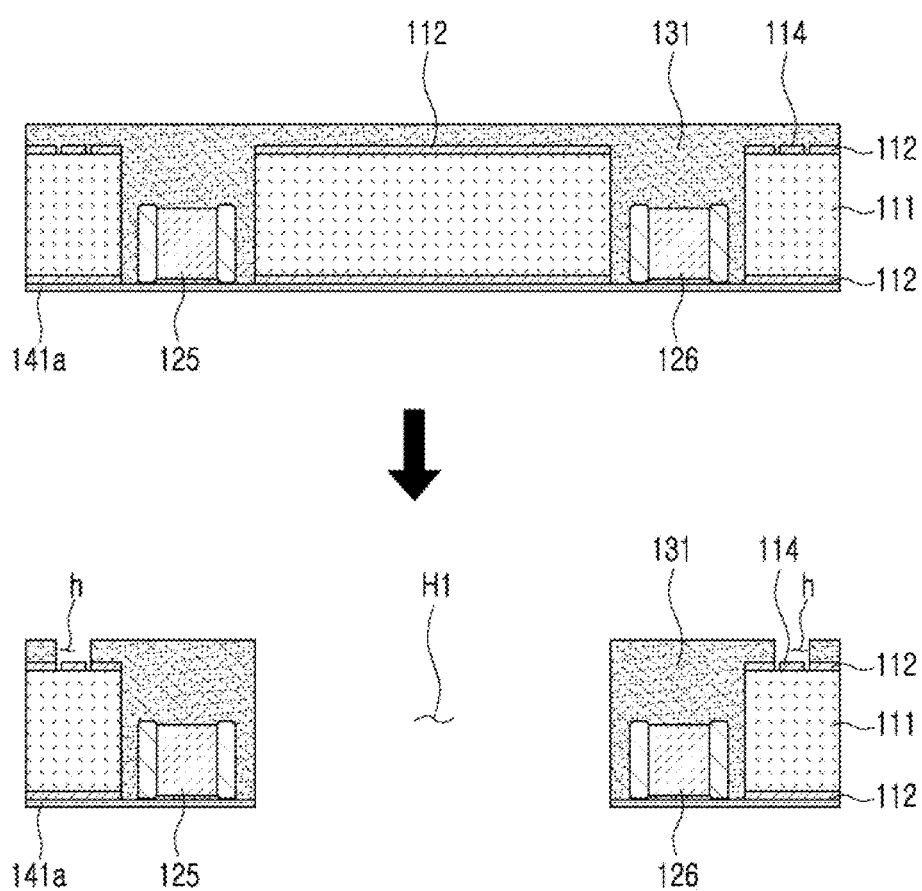
Figure 15:
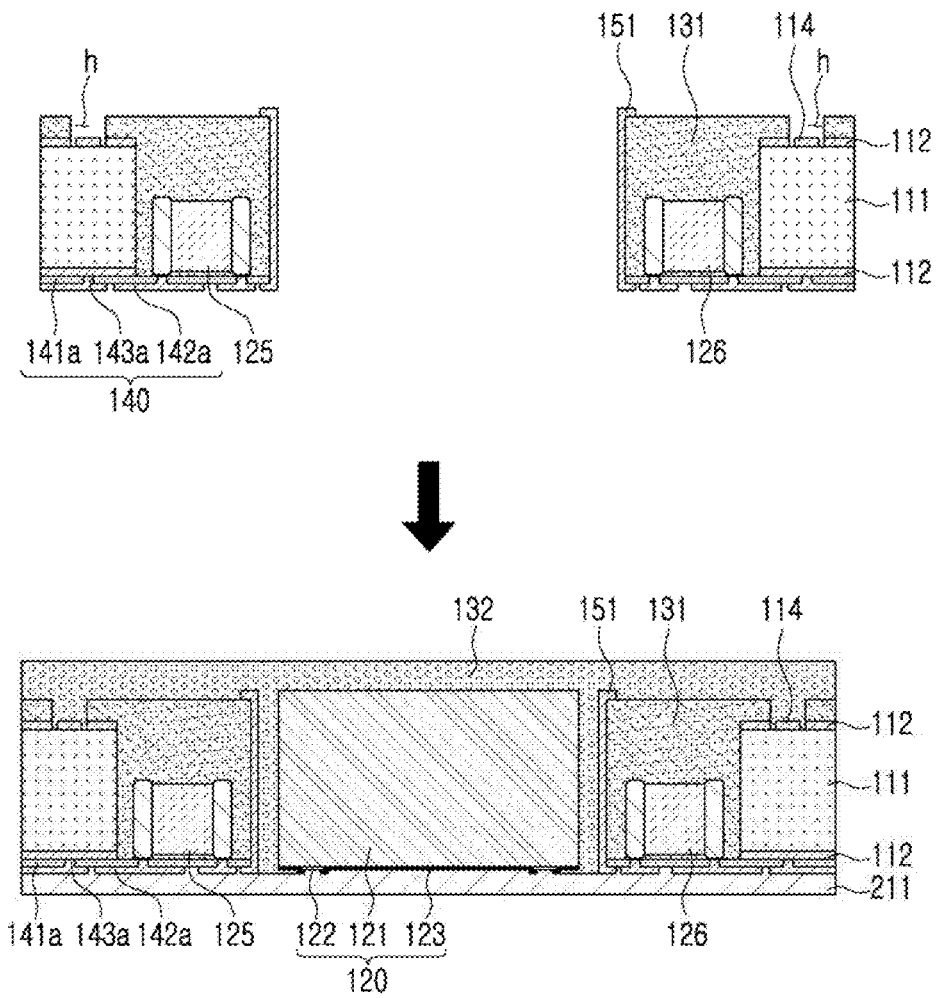

FIGS. 13 through 15 are schematic views illustrating an example of processes of manufacturing the semiconductor package of FIG. 9.

First, as shown in FIG. 13, a frame 111 having a frame wiring layer 112 and a marking region 114 formed on a surface thereof may be prepared. The frame 111 may be obtained by machining, for example, a copper clad laminate (CCL). FIG. 13 illustrates a state in which the frame wiring layer 112 and the marking region 114 are formed on the surface of the frame 111, but the frame wiring layer 112 and the marking region 114 may also be formed during a subsequent process. Through-holes H5 may be formed in the frame 111 by using a laser drill and/or a mechanical drill or sandblast. Next, an adhesive film 210 may be attached to a lower side of the frame 111, and passive components 125 and 126 may be disposed in the through-holes H5. The adhesive film 210 may be a film, but is not limited thereto. In addition, the through-holes H5 in which the passive components 125 and 126 are disposed may be separated into two regions, but may also be connected to each other.

Thereafter, the frame 111 and the passive components 125 and 126 may be encapsulated by using a first encapsulant 131. The first encapsulant 131 may be formed by a method of laminating an uncured film and then curing the film, and may also be formed by a method of applying a liquid material and then curing the liquid material. Next, the adhesive film 210 may be removed. As a method of removing the adhesive film 210, a mechanical method may be used.

Thereafter, as shown in FIG. 14, a first insulating layer 141a may be formed on a portion from which the adhesive film 210 is removed by using an ABF lamination method, or the like, and a portion of the frame 111 may be removed to form a through-hole H1 in the first encapsulant 131. FIG. 14 illustrates the form in which a central portion of the frame 111 is removed. The frame 111 and the first encapsulant 131 may be removed together to form the through-hole H1 and in some cases, only the first encapsulant 131 may be removed. The through-hole H1 may also extend through the first insulating layer 141a, as shown in FIG. 14.

Thereafter, as shown in FIG. 15, opened regions h may be formed by partially removing the first encapsulant 131 so that the marking region 114 is exposed, and a laser machining process, or the like may be used. In addition, after via holes are formed in the first insulating layer 141a by a laser-via, a first wiring layer 142a and the first connection via(s) 143a may be formed by a plating process such as SAP or MSAP. That is, the first wiring layer 142a and the first connection via(s) 143a may include a seed layer and a conductor layer having a thickness greater than that of the seed layer, respectively. A metal layer 151 may also be formed on side surfaces of the through-hole H1. Next, an adhesive film 211 may be attached to a lower portion of the first insulating layer 141a, and a semiconductor chip 120 may be attached onto the adhesive film 211 in a facedown form. Next, the first encapsulant 131 and the semiconductor chip 120 may be encapsulated by the second encapsulant 132. Similarly, the second encapsulant 132 may be formed by a method of laminating an uncured film and then curing the film, and may also be formed by a method of applying a liquid material and then curing the liquid material.

Thereafter, a connection structure 140 may be formed by removing the adhesive film 211 and then forming a second insulating layer 141b on the first insulating layer 141a and on an active surface of the semiconductor chip 120 by lamination of a photo imageable dielectric (PID) material, or the like, and forming via holes by a photo-via method and similarly then forming a second wiring layer 142b and a second connection via(s) 143b by a plating process. The second wiring layer 142b and the second connection via(s) 143b may also include a seed layer and a conductor layer. Next, a passivation layer 150 may be formed on the connection structure 140 by a lamination method or coating method. In addition, underbump metal layers 160 may be formed by a plating process. The underbump metal layer(s) 160 may also include a seed layer and a conductor layer. Next, when electrical connection structures 170 are formed on the underbump metal layers 160, the semiconductor package 100 according to an example described above may be manufactured.

FIGS. 16 through 19 illustrate semiconductor packages according to modified examples. Hereinafter, modified portions in the above-described exemplary embodiments will be mainly described.

Figure 16:
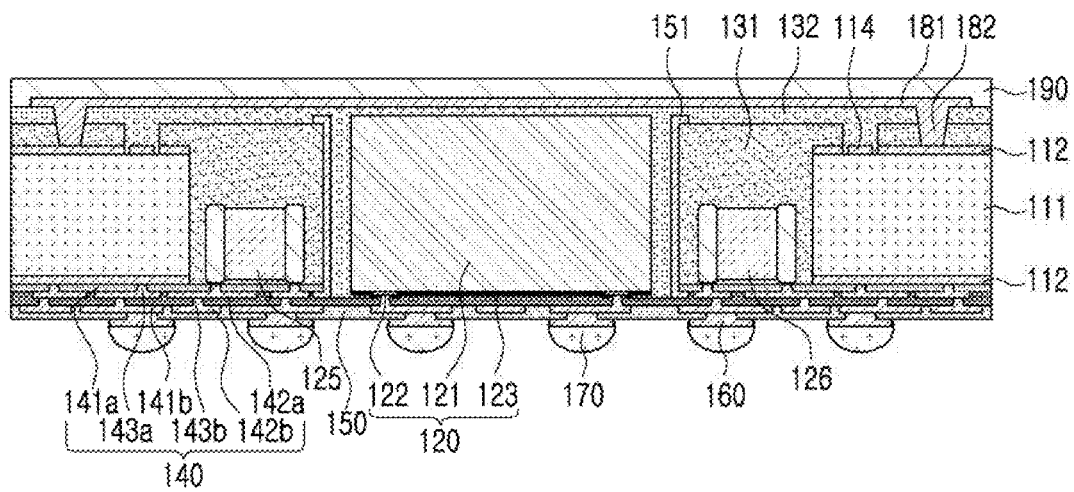
FIGS. 16 through 19 illustrate semiconductor packages according to modified examples in the present disclosure.

First, a semiconductor package according to an exemplary embodiment of FIG. 16 may further include a backside metal layer 181 disposed on the second encapsulant 132. In this case, a cover layer 190 covering the backside metal layer 181 may be employed to protect the backside metal layer 181. The cover layer 190 may include an insulating resin and inorganic filler, but may not include a glass fiber. For example, the cover layer 190 may be formed of ABF, but is not limited thereto. The passivation layer 150 and the cover layer 190 may include the same material and also serve to control a coefficient of thermal expansion (CTE) with a symmetrical effect.

The backside metal layer 181 may be disposed to cover the semiconductor chip 120 and the passive components 125 and 126, and may be connected to the frame wiring layer 112 or the like through a backside metal via 182 penetrating through the first and second encapsulants 131 and 132. Since the semiconductor chip 120 and the passive components 125 and 126 may be surrounded by a shielding layer through the backside metal layer 181 and the backside metal via 182, an EMI shielding effect and a heat dissipation effect may be further improved. A material of each of the backside metal layer 181 and the backside metal via 182 may be a conductive material such as copper (Cu), aluminum (Al), silver (Ag), tin (Sn), gold (Au), nickel (Ni), lead (Pb), titanium (Ti), or alloys thereof. The backside metal layer 181 and the backside metal via 182 may be used as a ground, and in this case may be electrically connected to the grounds of the wiring layers 142a and 142b of the connection structure 140 through the metal layer 151, the frame wiring layer 112, and the like. The backside metal layer 181 may have a plate form covering most of the upper surface of the second encapsulant 132.

Figure 17:
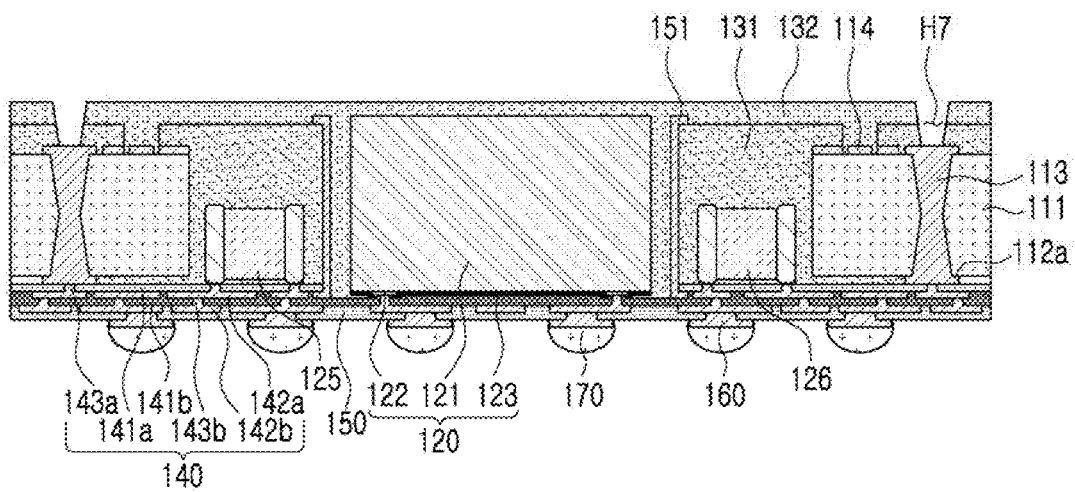

In a semiconductor package according to an exemplary embodiment of FIG. 17, the frame 111 may include wiring layers 112a disposed on a lower surface and an upper surface thereof, respectively, and wiring vias 113 penetrating through the frame 111 and connecting the wiring layers 112a to each other. In addition, as shown, the wiring vias 113 may have an hourglass shape. A through hole H7 is optionally formed through the encapsulants 131 and 132 to expose the upper wiring layers 112a and thereby enable connections thereto.

Optionally, the frame 111 may have a structure in which a metal layer forming a through-hole is formed, and may perform an electromagnetic wave shielding function, a heat dissipation function, or the like of the semiconductor chip 120. The metal layer may include copper (Cu), aluminum (Al), silver (Ag), tin (Sn), gold (Au), nickel (Ni), lead (Pb), titanium (Ti), or alloys thereof, but is not limited thereto.

Figure 18:
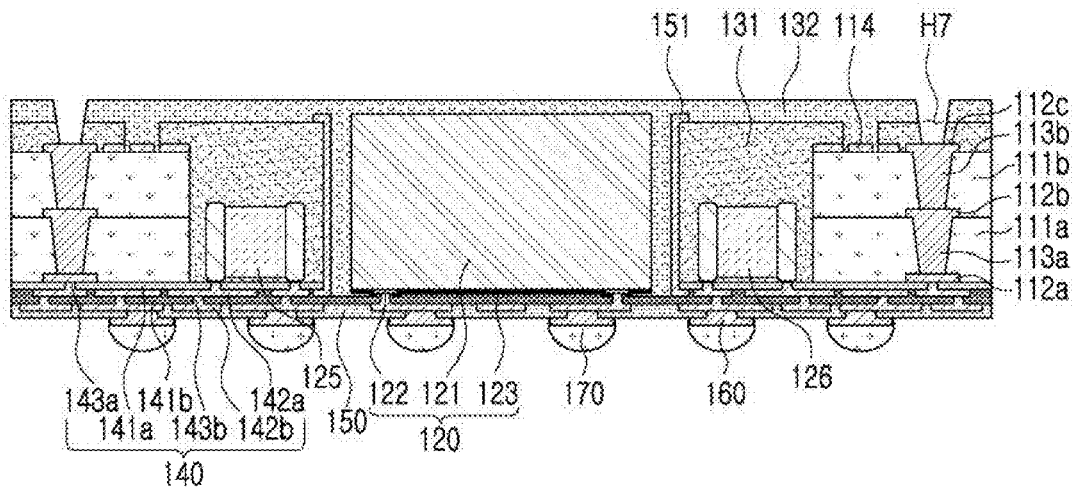

A semiconductor package according to an exemplary embodiment of FIG. 18 may also have a modified form of the frame, and may include a first frame 111a in contact with the connection structure 140, a first wiring layer 112a in contact with the connection structure 140 and embedded in the first frame 111a, a second wiring layer 112b disposed on the other surface of the first frame 111a opposing one surface of the first frame 111a in which the first wiring layer 112a is embedded, a second frame 111b disposed on the first frame 111a and covering at least a portion of the second wiring layer 112b, and a third wiring layer 112c disposed on the second frame 111b. The first to third wiring layers 112a, 112b, and 112c may be electrically connected to connection pads 122. The first and second wiring layers 112a and 112b and the second and third wiring layers 112b and 112c may be electrically connected to each other through first and second wiring vias 113a and 113b penetrating through the first and second frames 111a and 111b, respectively.

The first wiring layer 112a may be recessed into the first frame 111a. As described above, when the first wiring layer 112a is recessed into the first frame 111a and a lower surface of the first frame 111a and a lower surface of the first wiring layer 112a have a step therebetween, a phenomenon in which a material of the first encapsulant 131 bleeds to pollute the first wiring layer 112a may be prevented. A thickness of each of the wiring layers 112a, 112b, and 112c may be greater than that of the wiring layers 142a and 142b of the connection structure 140.

A material of each of the frames 111a and 111b is not particularly limited. For example, an insulating material may be used as the material of the frames 111a and 111b. In this case, a thermosetting resin such as an epoxy resin, a thermoplastic resin such as polyimide, a resin in which the thermosetting resin and the thermoplastic resin are mixed with an inorganic filler, for example, an Ajinomoto Build-up Film (ABF), or the like, may be used as the insulating material. Alternatively, a PID resin may also be used as the insulating material.

When holes for the first wiring vias 113a are formed, some of the pads of the first wiring layer 112a may serve as a stopper, and it may thus be advantageous in a process that each of the first wiring vias 113a has the tapered shape of which a width of an upper surface is greater than that of a lower surface. In this case, the first wiring vias 113a may be integrated with pad patterns of the second wiring layer 112b. In addition, when holes for the second wiring vias 113b are formed, some of the pads of the second wiring layer 112b may serve as a stopper, and it may thus be advantageous in a process that each of the second wiring vias 113b has the tapered shape of which a width of an upper surface is greater than that of a lower surface. In this case, the second wiring vias 113b may be integrated with pad patterns of the third wiring layer 112c.

Figure 19:
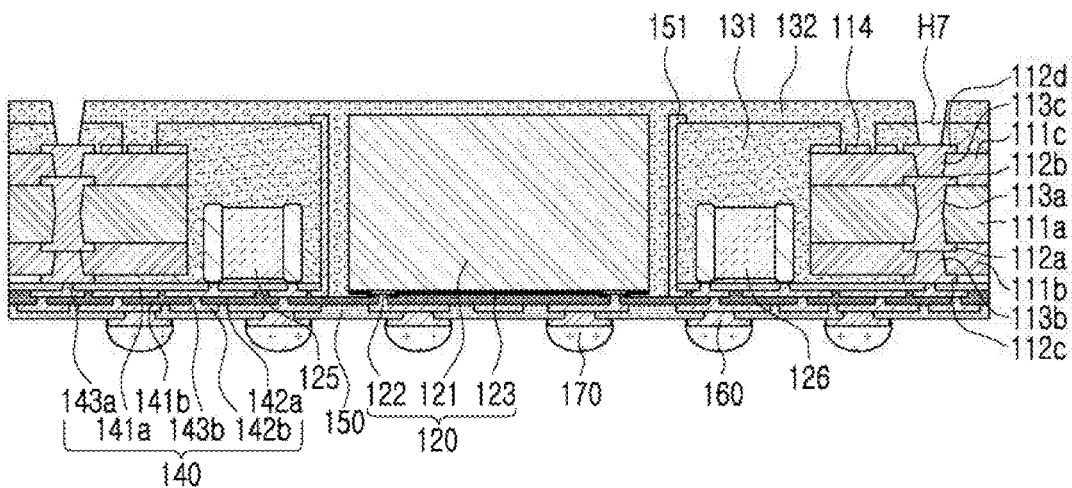

In a case of an exemplary embodiment of FIG. 19, a semiconductor package may include a first frame 111a, a first wiring layer 112a and a second wiring layer 112b which are disposed on a lower surface and an upper surface of the first frame 111a, respectively, a second frame 111b disposed on the lower surface of the first frame 111a and covering at least a portion of the first wiring layer 112a, a third wiring layer 112c disposed on a lower surface of the second frame 111b, a third frame 111c disposed on the upper surface of the first frame 111a and covering at least a portion of the second wiring layer 112b, and a fourth wiring layer 112d disposed on an upper surface of the third frame 111c. The first to fourth wiring layers 112a, 112b, 112c, and 112d may be electrically connected to connection pads 122. Since the frame may include a large number of wiring layers 112a, 112b, 112c, and 112d, a connection structure 140 may be further simplified. Therefore, a decrease in a yield depending on a defect occurring in a process of forming the connection structure 140 may be suppressed. Meanwhile, the first to fourth wiring layers 112a, 112b, 112c, and 112d may be electrically connected to each other through first to third wiring vias 113a, 113b, and 113c each penetrating through the first to third frames 111a, 111b, and 111c.

The first frame 111a may include an insulating material different from those of the second frame 111b and the third frame 111c. For example, the first frame 111a may be, for example, prepreg including a core material, a filler, and an insulating resin, and the second frame 111b and the third frame 111c may be an ABF or a PID including a filler and an insulating resin, but are not limited thereto. Similarly, the first wiring vias 113a penetrating through the first frame 111a may have a diameter greater than those of second and third wiring vias 113b and 113c each penetrating through the second and third frames 111b and 111c. Similarly, a thickness of each of the wiring layers 112a, 112b, 112c, and 112d may be greater than that of the wiring layers 142a and 142b of the connection structure 140.

Figure 20:
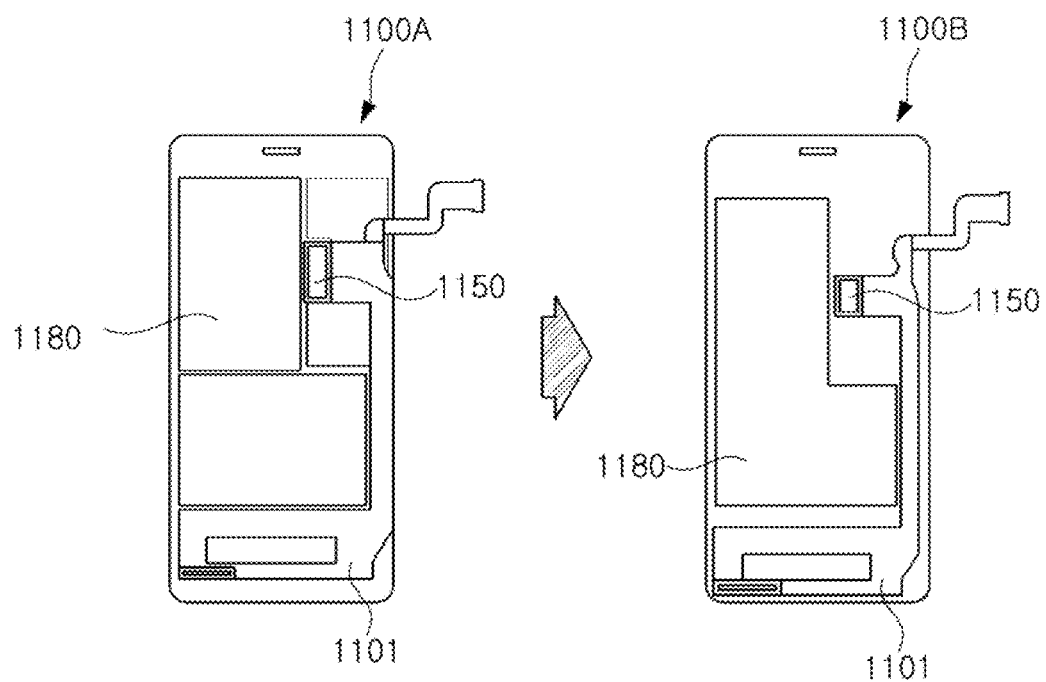
FIG. 20 is a schematic plan view illustrating an effect of using a semiconductor package according to the exemplary embodiments in the present disclosure in an electronic device.

FIG. 20 is a schematic plan view illustrating an advantageous effect of applying the semiconductor package according to the exemplary embodiments in the present disclosure to an electronic device.

Referring to FIG. 20 recently, in accordance with an increase in a size of displays for mobile apparatuses 1100A and 1100B, a need has arisen to increase capacity of batteries. In accordance with the increase in the capacity of the batteries, an area occupied by the battery 1180 in the mobile device has increased, and it has been thus requested to reduce a size of a printed circuit board 1101 such as a main board. As a result, due to a reduction in the mounting area of the components, an area occupied by a module 1150 including the PMIC and the passive components accordingly becomes continuously small. In this case, when the semiconductor package according to the above-described exemplary embodiments is applied to the module 1150, since the size may be significantly reduced, the reduced area may also be effectively used.

In the present disclosure, terms "lower side", "lower portion", "lower surface", and the like, have been used to indicate a downward direction in relation to cross sections of the drawings, and terms "upper side", "upper portion", "upper surface", and the like, have been used to indicate a direction opposing the direction indicated by the terms "lower side", "lower portion", "lower surface", and the like. However, these directions are defined for convenience of explanation, and the claims are not particularly limited by the directions defined as described above, and the concept of the upper portion and the lower portion may be changed at any time.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first component may be named a second component and a second component may also be similarly named a first component, without departing from the scope of the present disclosure.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiment in the present disclosure, the mounting area of the semiconductor chip and the plurality of passive components may be significantly reduced, and the electrical pathways between the semiconductor chip and the passive components may be significantly reduced. Further, the semiconductor package in which the degree of precision of mounting of the semiconductor chip is improved may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a connection structure including an insulating layer, a wiring layer disposed on the insulating layer, and a connection via penetrating through the insulating layer and connected to the wiring layer;
   a frame disposed on the connection structure and having one or more through-holes;
   a semiconductor chip and passive components disposed in the one or more through-holes of the frame on the connection structure;
   a first encapsulant covering at least portions of the passive components and the frame and forming a through-hole;
   a first metal layer disposed on an inner wall of the first encapsulant forming the through-hole;
   a frame wiring layer disposed on the frame; and
   a location identifying mark disposed around the semiconductor chip on the frame and spaced apart from the frame wiring layer,
   wherein at least a portion of the location identifying mark is not covered by the first encapsulant.

2. The semiconductor package of claim 1, further comprising a second encapsulant covering at least a portion of the semiconductor chip.

3. The semiconductor package of claim 2, wherein the second encapsulant covers side surfaces and an upper surface of the semiconductor chip, and the first encapsulant.

4. The semiconductor package of claim 1, wherein the semiconductor chip and the passive components are disposed in a same through-hole of the one or more through-holes of the frame.

5. The semiconductor package of claim 4, wherein the first encapsulant extends into the same through-hole of the frame, and the semiconductor chip is disposed in the through-hole formed in the first encapsulant that extends into the same through-hole of the frame.

6. The semiconductor package of claim 1, wherein the semiconductor chip and the passive components are disposed in different through-holes of the one or more through-holes.

7. The semiconductor package of claim 1, wherein a second metal layer is disposed on inner walls of the frame forming the one or more through-holes.

8. The semiconductor package of claim 1, wherein the location identifying mark takes a form of a metal pattern.

9. The semiconductor package of claim 1, wherein the location identifying mark and the frame wiring layer are formed of the same material as each other.

10. The semiconductor package of claim 1, wherein the location identifying mark is physically and electrically separated from the frame wiring layer.

11. The semiconductor package of claim 1, wherein the location identifying mark has a symmetrical structure in relation to the through-hole of the frame in which the semiconductor chip is disposed when viewed from above.

12. The semiconductor package of claim 1, wherein the semiconductor chip is disposed so that connection pads of the semiconductor chip face the connection structure.

13. A semiconductor package comprising:
- a connection structure including an insulating layer, a wiring layer disposed on the insulating layer, and a connection via penetrating through the insulating layer and connected to the wiring layer;
- a frame disposed on the connection structure and having one or more through-holes;
- a semiconductor chip and passive components disposed in the one or more through-holes of the frame on the connection structure;
- a first encapsulant covering at least portions of the passive components and the frame and forming a through-hole;
- a frame wiring layer disposed on the frame;
- a location identifying mark disposed around the semiconductor chip on the frame and spaced apart from the frame wiring layer; and
- a second encapsulant covering at least a portion of the semiconductor chip,
- wherein at least a portion of the location identifying mark is not covered by the first encapsulant,
- wherein the second encapsulant covers side surfaces and an upper surface of the semiconductor chip, and the first encapsulant, and
- wherein the second encapsulant covers an exposed portion of the location identifying mark which is not covered by the first encapsulant.

14. A semiconductor package comprising:
- a frame having an upper surface, a lower surface opposing the upper surface, and a through-hole extending from the upper surface to the lower surface;
- a semiconductor chip disposed in the through-hole; and
- a plurality of identifying marks symmetrically disposed relative to the semiconductor chip on the upper surface of the frame,
- wherein a metal layer is disposed on inner walls of the frame forming the through-hole.

15. The semiconductor package of claim 14, further comprising:
- a conductive frame wiring layer disposed on the upper surface of the frame,
- wherein the identifying marks are disposed around the semiconductor chip on the upper surface of the frame to be spaced apart from the conductive frame wiring layer.

16. The semiconductor package of claim 15, wherein the identifying marks and the conductive frame wiring layer are formed of a same material as each other.

17. The semiconductor package of claim 14, further comprising:
- an encapsulant covering a portion of the frame and extending into the through-hole between the frame and the semiconductor chip,
- wherein the identifying marks are free of the encapsulant.

18. The semiconductor package of claim 17, further comprising:
- one or more passive components disposed in the through-hole, electrically connected to the semiconductor chip, and embedded in the encapsulant.

19. The semiconductor package of claim 14, further comprising:
- a connection structure including a redistribution layer connected to connection pads of the semiconductor chip,
- wherein the lower surface of the frame is disposed on the connection structure.

* * * * *